US008228763B2

(12) United States Patent
Henzler

(10) Patent No.: US 8,228,763 B2
(45) Date of Patent: Jul. 24, 2012

(54) METHOD AND DEVICE FOR MEASURING TIME INTERVALS

(75) Inventor: Stephan Henzler, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 598 days.

(21) Appl. No.: 12/101,814

(22) Filed: Apr. 11, 2008

(65) Prior Publication Data

US 2009/0257319 A1 Oct. 15, 2009

(51) Int. Cl.
*G04F 8/00* (2006.01)
*H03H 11/26* (2006.01)

(52) U.S. Cl. ......... 368/118; 368/120; 327/276; 327/284

(58) Field of Classification Search .................. 368/113, 368/118, 120; 327/269, 284, 276–279; 341/155–157, 166
See application file for complete search history.

(56) References Cited

U.S. PATENT DOCUMENTS

| | | | | | |
|---|---|---|---|---|---|
| 4,719,608 | A | * | 1/1988 | Genat et al. | 368/113 |
| 5,818,797 | A | * | 10/1998 | Watanabe et al. | 368/113 |
| 5,838,754 | A | * | 11/1998 | Gorbics et al. | 377/20 |
| 5,982,712 | A | * | 11/1999 | Smith | 368/120 |
| 6,060,928 | A | * | 5/2000 | Jun et al. | 327/261 |
| 6,501,706 | B1 | * | 12/2002 | West | 368/118 |
| 6,868,047 | B2 | * | 3/2005 | Sartschev et al. | 368/118 |
| 7,339,853 | B2 | * | 3/2008 | Srikantam et al. | 368/113 |
| 7,501,973 | B2 | * | 3/2009 | Choi et al. | 341/166 |
| 2004/0217788 | A1 | * | 11/2004 | Kim | 327/158 |
| 2006/0066372 | A1 | * | 3/2006 | Collins et al. | 327/284 |
| 2006/0087323 | A1 | * | 4/2006 | Furse et al. | 324/519 |
| 2008/0198700 | A1 | * | 8/2008 | Franch et al. | 368/120 |

* cited by examiner

*Primary Examiner* — Vit Miska
(74) *Attorney, Agent, or Firm* — Lee & Hayes, PLLC

(57) ABSTRACT

A device is disclosed for measuring a plurality of time intervals.

23 Claims, 17 Drawing Sheets

202

FIG. 7
Start_1
Start_2
Stop
Blk_1
Blk_2
Ckp_1
Ckp_2
Ckp_3
Ckp_4

METHOD AND DEVICE FOR MEASURING TIME INTERVALS

BACKGROUND

A time-to-digital converter (TDC) can be used for a variety of purposes. For example, a TDC can be used to measure the duration of time that has elapsed between a START and a STOP pulse or any other timing event. It can also be used to output the time of arrival for an incoming pulse. High resolution TDCs are increasingly popular in many applications, including time of flight measurements, phase detectors in phase-locked-loops (PLLs), data converters, high speed signal capturing, demodulators, and other measurement or instrumentation applications.

Conventional TDC systems allow a single TDC to perform only single measurements at any one time. This means that simultaneous measurements of 2 or more time intervals cannot be performed by a single TDC. Multiple TDCs have to be provided to measure multiple time intervals simultaneously. This increases the area consumption of the TDC system. Further, the TDC cannot be started immediately after the termination of the previous measurement. Not only does this limit the type of measurements that can be performed, it also slows down the operating efficiency of the TDC system. Dead or inert time slots, during which no acquisition can be performed, have to be injected when the TDC is calibrated. Calibration is essential, especially for high-precision applications, because process variations and component deviations can cause undesirable offsets in time and gain errors in the TDC converter characteristics. In conventional systems, calibration is typically performed in fixed calibration intervals, which is undesirable because the TDC is unable to respond quickly to changes. Moreover, some systems do not allow interruptions in operation for calibration purposes.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

At least one implementation described herein relates a device including at least one delay path for propagating at least one timing event. The device also includes a plurality of injection points provided along the delay path. The injection points are configurable to receive the timing event and to deliver the timing event to the delay path.

Another implementation described herein relates to a method of measuring at least one time interval. The method may include propagating at least one first timing event in a delay path, monitoring a position of the first timing event, selecting at least one injection point provided along the delay path based on the position the first timing event, applying a second timing event to the selected injection point without interfering with the first timing event, propagating the second timing event in the delay path, and generating at least one binary word in response to a stop signal, wherein the binary word is representative of the time interval being measured.

Exemplary Device

Figure 1A:
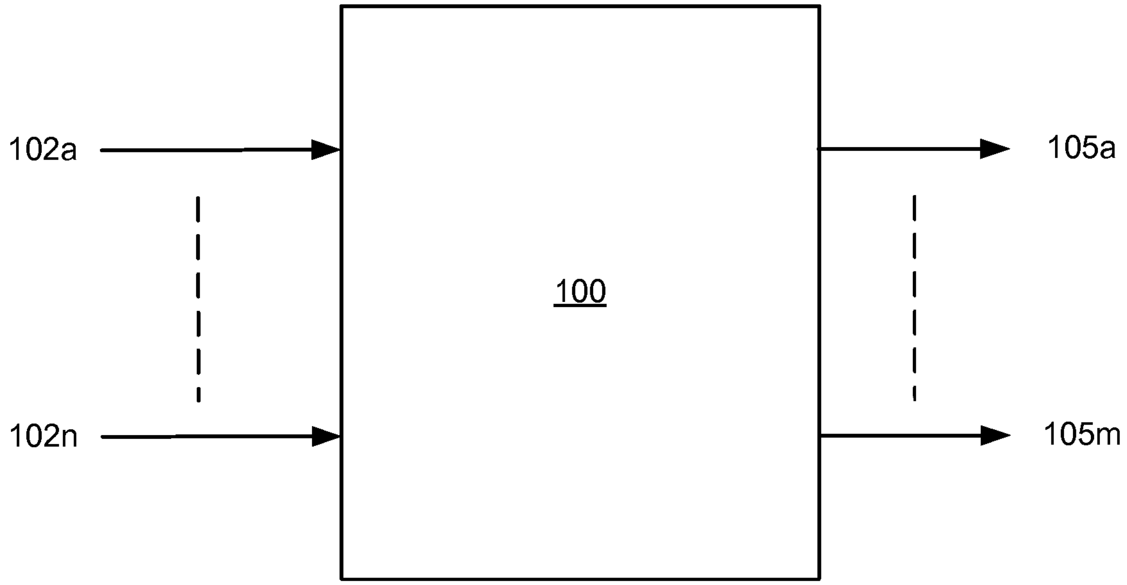
FIG. 1*a* shows a block diagram of a TDC in accordance with one implementation.

FIG. 1*a* shows a block diagram of a device operable to measure multiple time intervals. In one implementation, such a device comprises a time-to-digital converter (TDC). The TDC comprises one or more input terminals 102*a-n* configurable to receive timing signals. The number of input terminals can be 1, 2 or any other suitable number. A timing signal can be, for example, a "start" signal or a "stop" signal, or a combination of both, corresponding to the start or end of a time interval being measured. In response to the "start" signal, the TDC propagates a timing event along a delay path. It then provides, in response to the "stop" signal, a binary count of the time interval being measured at output terminals 105*a-m*. The number of output terminals may be any number, depending on the desired degree of resolution.

The device 100 may be configured to measure time intervals simultaneously. It may also be configured to continuously measure consecutive time intervals, with little or no "dead time" between measurements. At least one implementation of the device 100 includes a delay path and multiple injection points along the delay path for receiving timing events. A timing event, as used herein, may be a pulse, an active transition in an input signal (e.g., start signal), edge, or other suitable timing event.

Figure 1B:
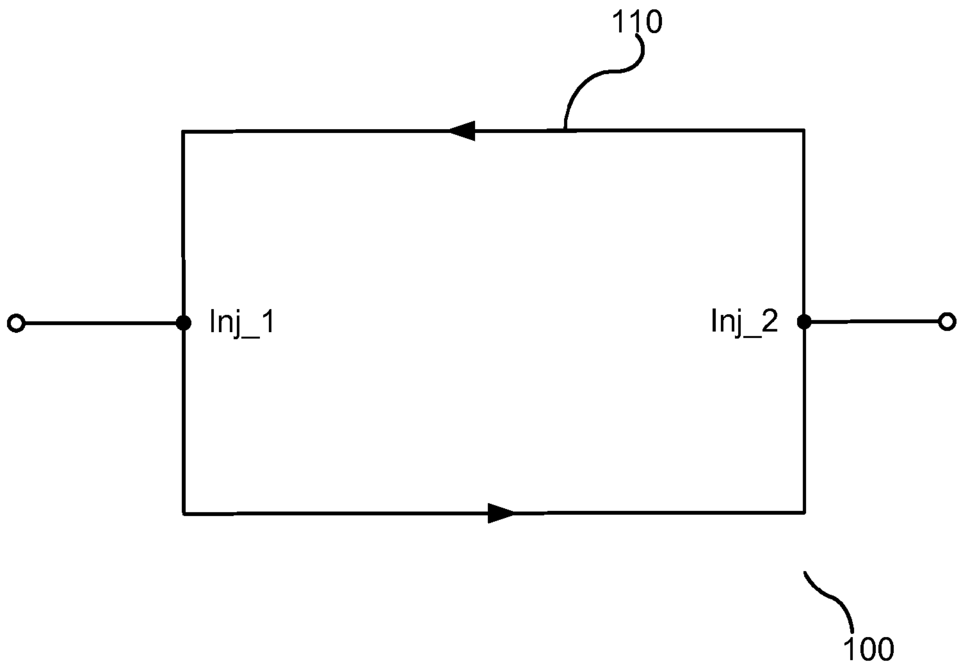
FIG. 1*b* shows a schematic operational diagram of the TDC shown in FIG. 1.

FIG. 1*b* shows one implementation of the device 100. Device 100 comprises a delay path 110 and a plurality of injection points (Inj_1 and Inj_2) provided along the delay path 110. Although only 2 injection points are shown in FIG. 1*b*, any other number of injection points (e.g., 3, 4, and so forth) may also be provided. Delay path 110 is configurable to propagate at least one timing event. The injection points are configurable to receive the timing event and to deliver the timing event to the delay path.

Figure 1C:
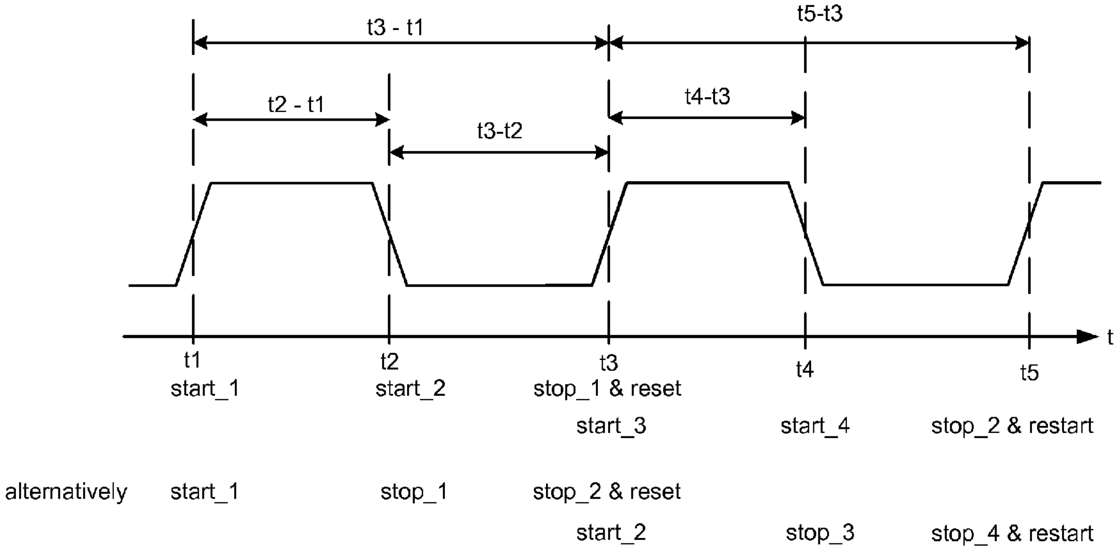
FIG. 1*c* shows an exemplary waveform and exemplary time intervals measured for the waveform with the TDC shown in FIG. 1.

FIG. 1*c* shows examples of time intervals that may be measured by TDC 100. Although details of exemplary time intervals are shown, it should be understood that other types or combinations of time intervals may also be measured. TDC 100 is operable to measure multiple time intervals simultaneously. In addition, it may be operable to measure consecutive time intervals continuously.

In one implementation, the measurements are made in response to multiple start signals (e.g., "start_1" and "start_2") and a common stop signal (e.g., "stop_1"). For example, the measurement of first time interval (t3-t1) may be made in response to timing signals "start_1" and "stop_1," corresponding to the start and end of the first time interval respectively. The TDC may be configurable to measure a second time interval (t3-t2) in parallel to the first measurement. Measurement of the second time interval (t3-t2) may be made in response to "start_2" and "stop_1," corresponding to the start and end of the second time interval respectively. Further, the TDC is configurable to measure a third time interval (t2-t1) simultaneously with the first or the second time intervals. The measurement result for the time interval (t2-t1) may be derived from the measurement results of the time intervals (t3-t1) and (t3-t2)

The TDC may be partially reset at time t3 to allow for further measurements of time intervals (e.g., t4-t3). The measurement of fourth time interval (t4-t3) can be made immediately upon the termination of previous measurements, i.e. immediately upon stop_1. In particular the new measurement can be started during the partial reset. The measurement of the fourth time interval can be made in response to "start_3" and "start_4," corresponding to the start and end of the fourth time interval. A fifth time interval (t5-t3) may be measured simultaneously, in response to timing signals "start_3" and "stop_2", corresponding to the start and end of the fifth time interval respectively, and so forth.

In another implementation, measurements are made in response to a common start signal (e.g., "start_1") and multiple stop signals (e.g., "stop_1" and "stop_2"). For example, the measurement of the first time interval (t2-t1) may be made in response to "start_1" and "stop_1." Measurement of the second time interval (t3-t1) may be made in response to "start_1" and "stop_2," and measurement of the third time interval (t3-t2) may be derived from the measurements of (t2-t1) and (t3-t1).

Similarly, the TDC may be partially reset at time t3 to allow for further measurements. Measurement of the fourth time interval (t4-t3) may be started immediately after the termination of previous measurements, upon receipt of a new start signal (e.g., "start_2") and end upon receipt of new stop signal (e.g., "stop_3"). The measurement may be started during the partial reset phase. The purpose of the partial reset is to erase timing events associated with previous measurements. Measurement of fifth time interval (t5-t3) may be made in response to "start_2" and "stop_4," and so forth.

Timing signals (e.g., "start_1", "start_2", "stop_1", "stop_2") may be generated upon occurrence of various START and STOP events defined by the user. Other types of configurations are also useful. By allowing multiple timing events to be injected into the delay path, the TDC allows multiple time intervals to be measured simultaneously and/or continuously. In addition, by allowing a partial reset, the TDC is configurable to continuously measure time intervals without the insertion of "dead time" when it is being reset. Therefore, even when the TDC is being calibrated, it may advantageously be used continuously for data acquisition without interrupting its operation.

Figure 2:
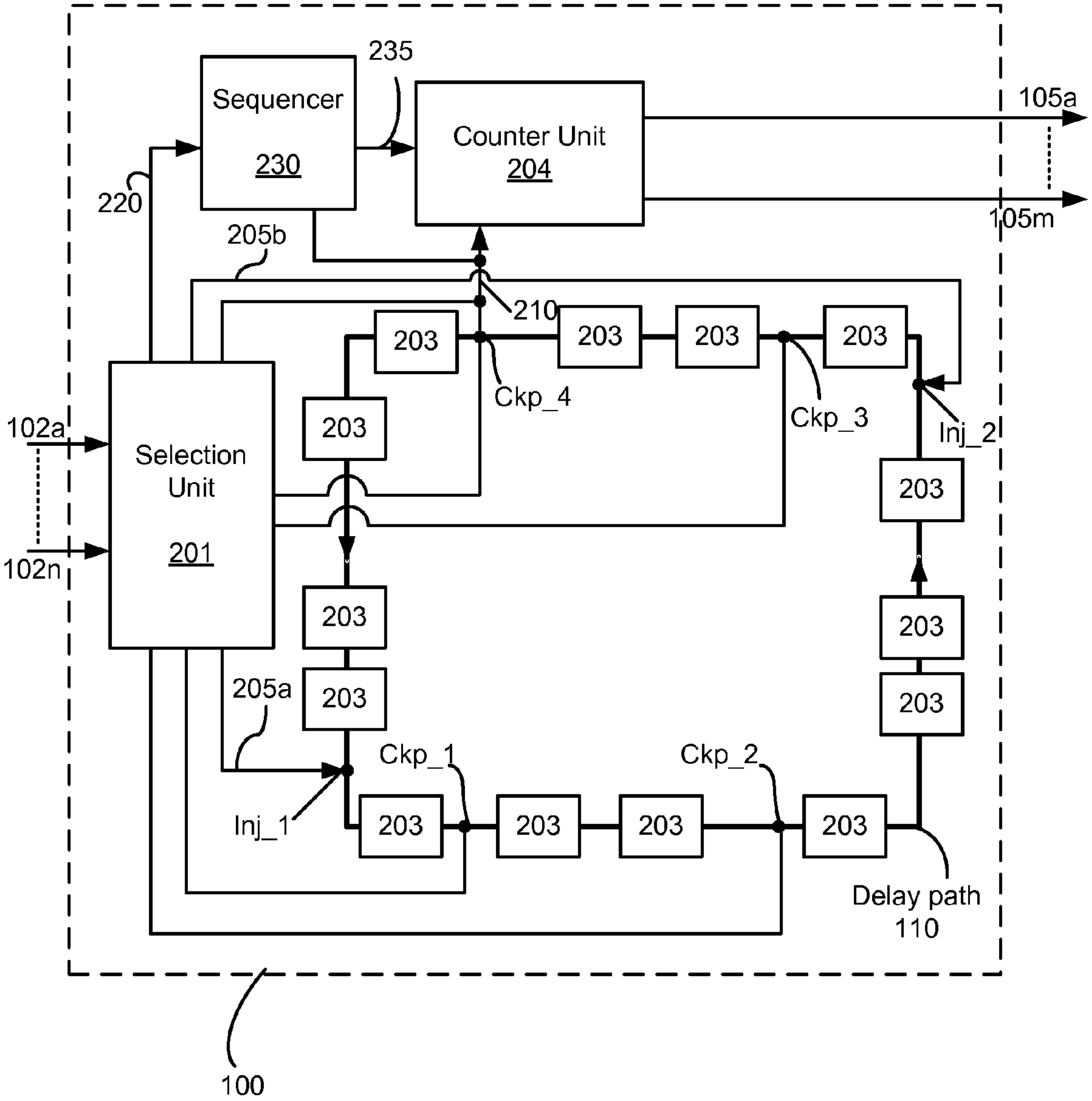
FIG. 2 shows a block diagram of exemplary components of the TDC shown in FIG. 1.

FIG. 2 illustrates in more detail the TDC 100 shown in FIG. 1. TDC 100 generally comprises a selection unit 201, a delay path 110, a sequencer 230 and a counter unit 204. In one implementation, delay path 110 comprises a plurality of delay units 203 coupled in series to form a ring. A plurality of checkpoints (e.g., Ckp_1, Ckp_2, Ckp_3, and Ckp_4) and injection points (e.g., Inj_1 and Inj_2) are provided along delay path 110. Although four checkpoints are shown in FIG. 2, any other number of checkpoints (e.g., 1, 2, 3, 4, 5 and so forth) may also be provided.

In one implementation, selection unit 201 is coupled to input terminals 102*a-n*, checkpoints (Ckp_1, Ckp_2, Ckp_3, Ckp_4), injection points (Inj_1 and Inj_2) and sequencer 230. When a new timing signal associated with a start event is received at one of the input terminals 102*a-n*, selection unit 201 directs a new timing event to one of the injection points (Inj_1 and Inj_2) via connectors 205*a* or 205*b* respectively. The new timing event is injected so as to avoid interfering with any previously injected timing events propagating within the delay path. The previously injected timing events may be any event already injected into, and propagating within, delay path 110. The term "new timing events" refers to timing events that have not been injected into the delay path.

Selection unit 201 selects an injection point to inject the new timing event based on current positions of previously injected timing events propagating along the delay path. Selection unit 201 may monitor current positions of the previously injected timing events via the checkpoints (Ckp_1, Ckp_2, Ckp_3, Ckp_4). In one implementation, the selection unit 201 sends its decision via connector 220 to sequencer 230. Sequencer 230 is coupled to counter unit 204. Sequencer 230 may serve to enable the appropriate counter for counting respective time intervals.

To avoid interfering with any previously injected timing events propagating within the delay path, selection unit 201 may block an injection point to prevent it from being selected when a previously injected timing event is propagating within the injection point's vicinity or blocking region. Blocking can be carried out by, for example, asserting a blocking signal associated with the injection point. In one implementation, the blocking region is defined around the injection point, including a portion of the delay path before and after the injection point. If a previously injected timing event enters a blocking region associated with an injection point, the injection point may be blocked. After the previously injected timing event leaves the blocking region, the injection point may be unblocked by, for example, deactivating the blocking signal.

For example, the blocking region of injection point Inj_1 may include Ckp_4 and Ckp_1. If a previously injected timing event enters the blocking region (e.g., by arriving at checkpoint Ckp_4), injection point Inj_1 is blocked by, for example, a block signal Blk_1 (not shown), to prevent any new timing event from being injected at that injection point Inj_1. The new timing event may be injected at injection point Inj_2 if it is not blocked. After the previously injected timing event leaves the blocking region (e.g., by arriving at Ckp_1), injection point Inj_1 may be unblocked by, for example, block signal Blk_1.

The blocking signal may be generated by a set-reset flip-flop device or other suitable bistable multivibrator coupled to the selection unit 201 and the injection point, e.g., Inj_1. To activate the blocking signal, a set signal coupled to the input of the flip-flop device is activated. Similarly, to deactivate the blocking signal, a reset signal coupled to the input of the flip-flop device is activated. Other types of logic devices may also be used.

Selection unit 201 may use various strategies for selecting an unblocked injection point to inject a new timing event. In one implementation, the injection points may be pre-assigned with different priorities. The selection unit 201 selects an unblocked injection point with the highest priority. For example, the selection unit 201 will try to select injection point with priority "1". If that injection point is blocked, it selects injection point with priority "2" if it is unblocked. In another implementation, the selection unit selects the injection point that allows the new timing event to be injected after the last previously injected timing event and before the first previously injected timing event. This allows the timing events to be ordered according to the times they were injected. For example, the first timing event to be injected into the delay path will arrive at a checkpoint before the second timing event to be injected and so forth. Other selection strategies are also useful.

Figure 3A:
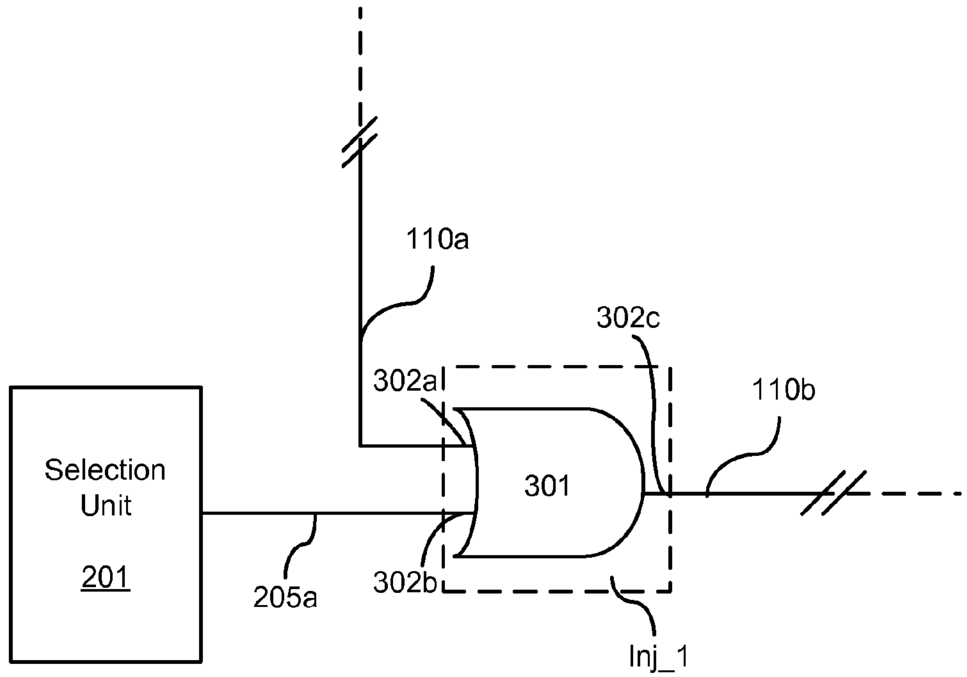
FIGS. 3*a-b* show schematic diagrams of exemplary implementations of an injection point for a TDC.
Figure 3B:
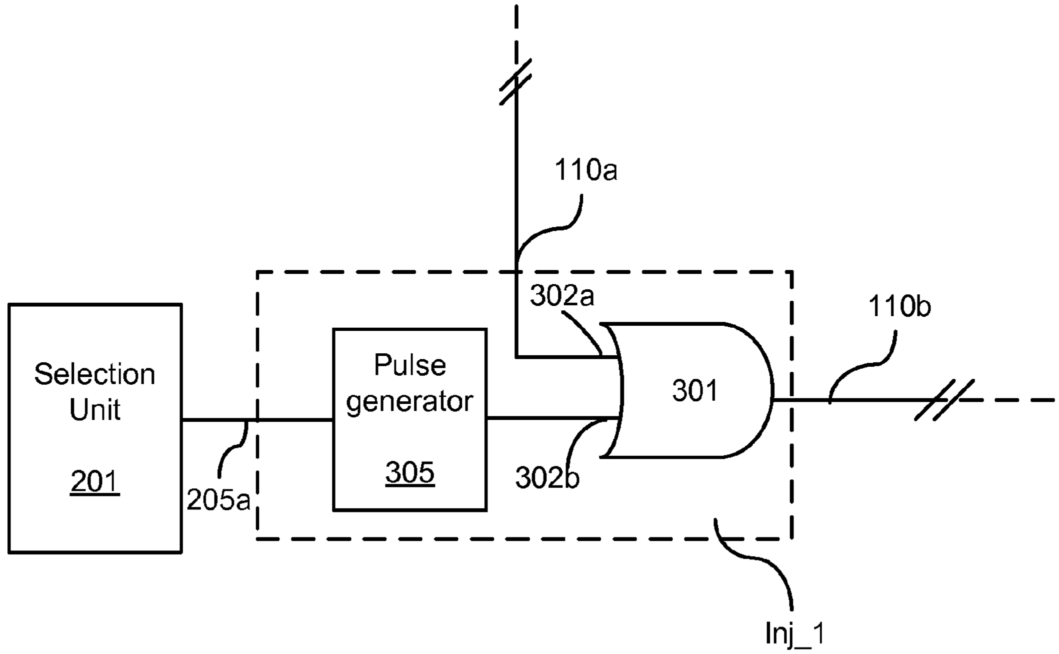

FIGS. 3*a*-*b* show various implementations of an injection point (e.g., Inj_1). These implementations are provided for illustrative purposes only, and other configurations are also useful. As shown in FIG. 3*a*, an injection point, e.g., Inj_1, comprises an OR logic device 301. Other types of logic devices (e.g., NOR logic device, multiplexer, and so forth) may also be used. The logic device includes first and second input terminals (302*a* and 302*b*) and an output terminal 302*c*. A first portion 110*a* of the delay path and the selection unit 201 are coupled to the first and second input terminals of the logic device 301, respectively. A second portion 110*b* of the delay path is coupled to the output terminal 302*c*. The logic device 301 delivers either a new timing event from the selection unit 201 via connector 205*a*, or a previously injected timing event from first portion 110*a* of the delay path 110 to second portion 110*b* of the delay path 110. Other types of configurations may also be used.

For example, FIG. 3*b* shows an injection point, e.g., Inj_1, that further includes a pulse generator 305 coupled to selection unit 201 and second input terminal 302*b* of the OR logic device 301. Pulse generator 305 generates a pulse in response to a new timing event received from the selection unit 201. The OR logic device 301 then delivers the pulse from the pulse generator 305 to second portion 110*b* of the delay path 110.

Figure 3C:
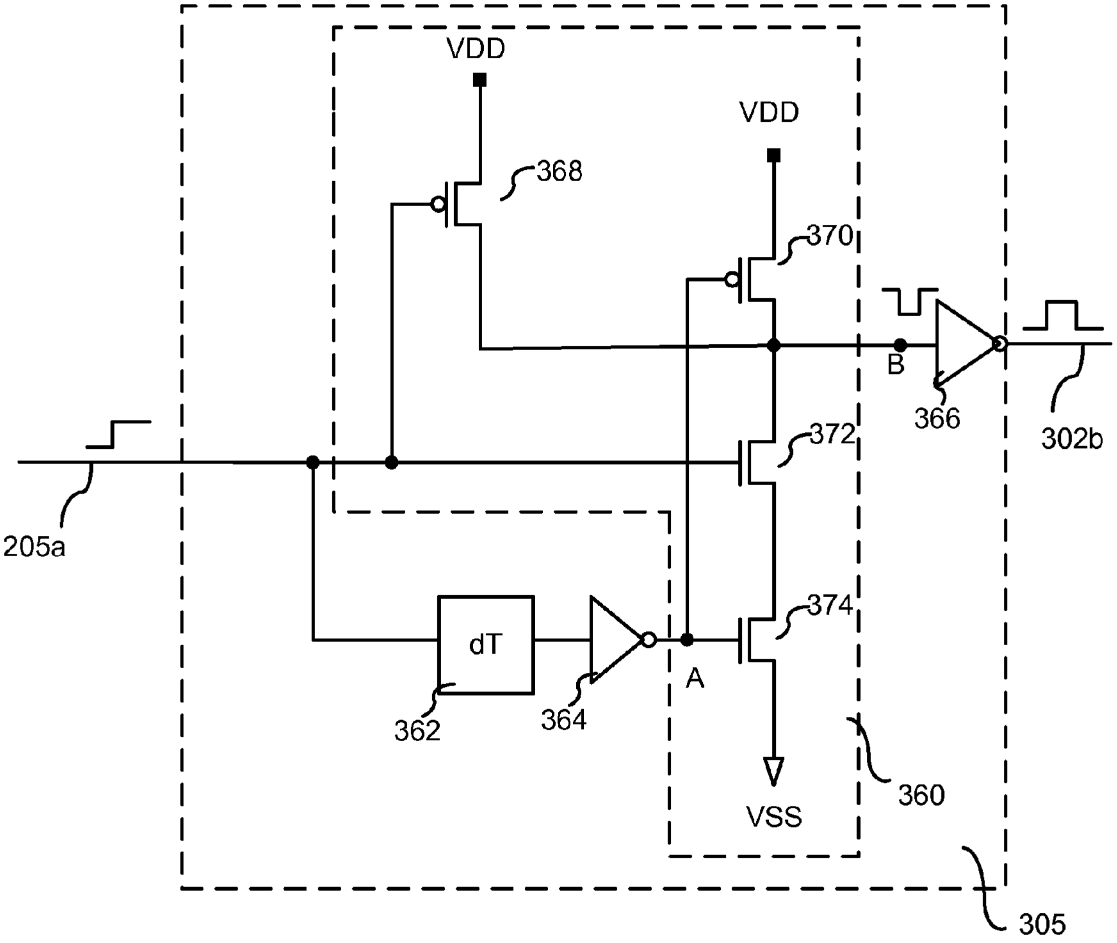
FIG. 3*c* shows a schematic diagram of an exemplary implementation of a pulse generator.

FIG. 3*c* shows a schematic diagram of an exemplary implementation of a pulse generator 305. It should be understood that other implementations of a pulse generator are also useful. The pulse generator 305 includes a NAND logic circuit 360, a delay element 362, and inverter devices (364 and 366). NAND logic circuit 360 comprises P-type transistors (368 and 370) and N-type transistors (372 and 374). Delay element 362 and inverter 364 cooperate to delay input signal received at connector 205*a* by a predetermined time, to produce a delayed and inverted signal at node A. The NAND logic circuit 360 executes a NAND operation between the input signal received at connector 205*a* and the delayed signal at node A, generating an output pulse at node B. The output pulse at node B starts at the moment of occurrence of a rising edge in the input signal at connector 205*a*. The inverter 367 inverts the pulse at node B, generating the output pulse at terminal 302*b*.

Figure 3D:
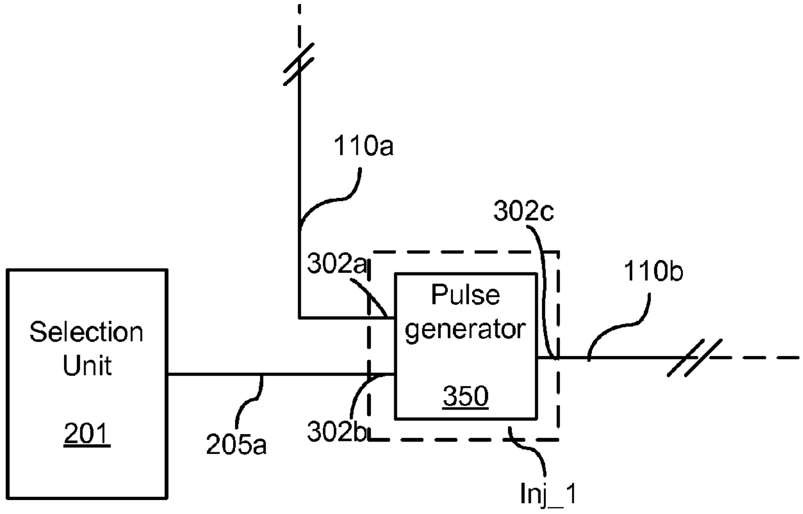
FIG. 3*d* shows a schematic diagram of an alternative exemplary implementation of an injection point.

FIG. 3*d* shows yet another implementation of an injection point (e.g., Inj_1). Injection point, e.g., Inj_1, comprises a pulse generator 350 having first and second input terminals 302*a* and 302*b*, and an output terminal 302*c*. First input terminal 302*a* is coupled to a first portion 110*a* of the delay path and second input terminal 302*b* is coupled to the selection unit 201. Output terminal 302*c* is coupled to second portion 110*b* of the delay path 110. The pulse generator 350 is operable to produce an output pulse at output terminal 302*c* in response to an active transition or edge occurring at either first or second input terminal (302*a* or 302*b* respectively).

Figure 3E:
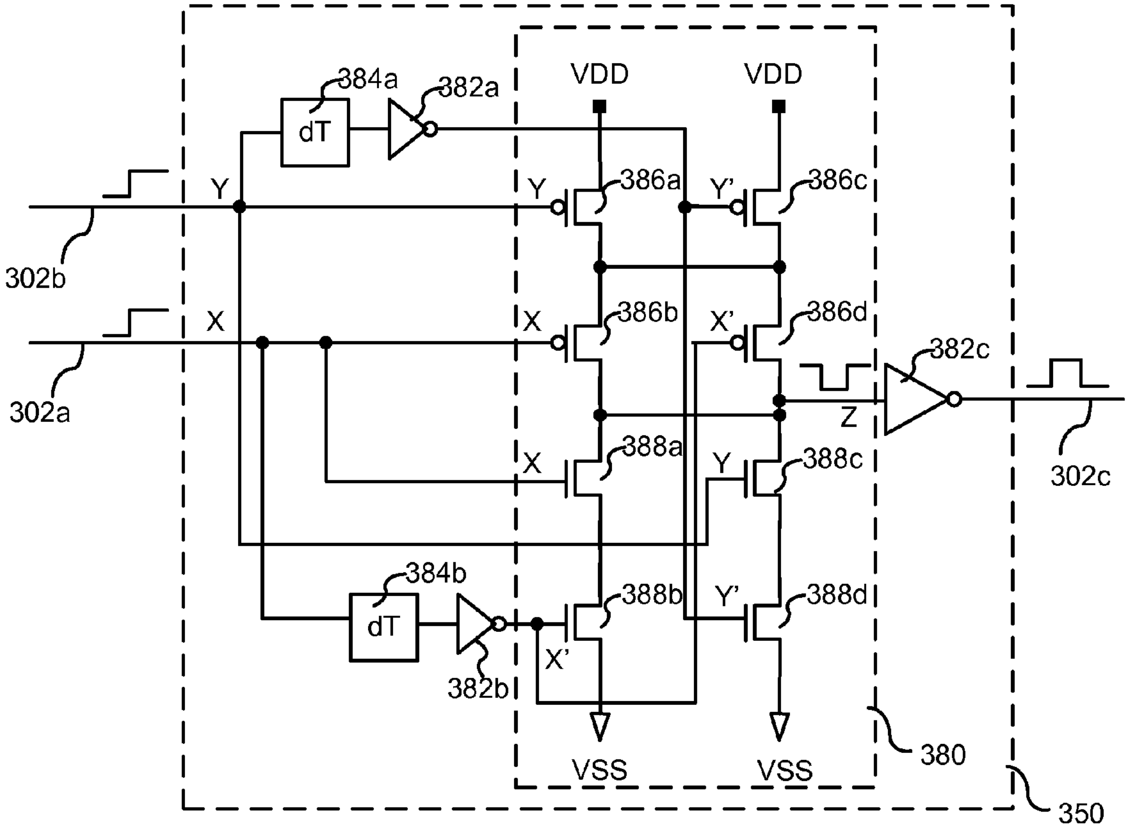
FIG. 3*e* shows a schematic circuit diagram of an alternative exemplary implementation of a pulse generator.

FIG. 3*e* shows a schematic diagram of an exemplary implementation of pulse generator 350. Pulse generator 350 comprises a multiplexer logic circuit 380, inverter devices (382*a*, 382*b* and 382*c*) and delay elements (384*a* and 384*b*). Multiplexer logic circuit 380 comprises P-type transistors (386*a*, 386*b*, 386*c* and 386*d*) and N-type transistors (388*a*, 388*b*, 388*c*, and 388*d*). Delay element 384*b* and inverter device 382*b* cooperate to delay input signal X received at first input terminal 302*a* to produce a delayed and inverted signal X'. Similarly, delay element 384*a* and inverter device 382*a* cooperate to delay input signal Y received at second input terminal 302*b* produce a delayed and inverted signal Y'. The multiplexer logic circuit 380 generates an output pulse Z. The output pulse Z starts at the moment of occurrence of a rising edge in the input signals X or Y. The inverter 381 inverts the pulse Z, generating the output pulse at output terminal 302*c*.

Figure 4A:
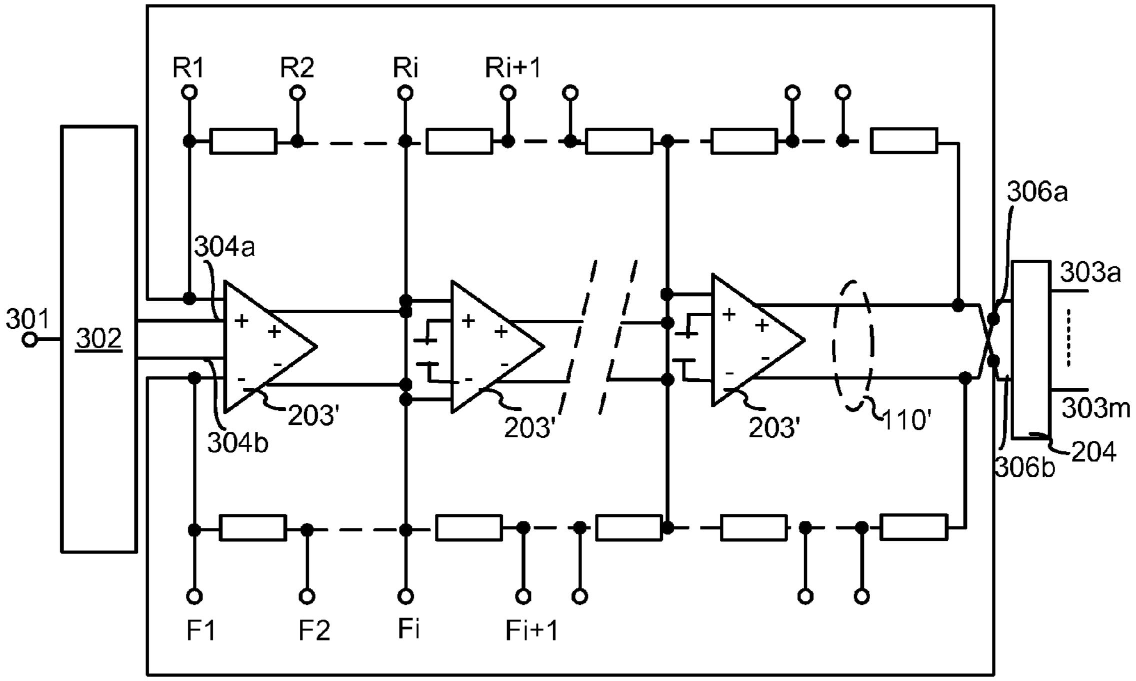
FIGS. 4*a-b* show schematic circuit diagrams of exemplary implementations of a delay path and delay unit respectively.
Figure 4B:
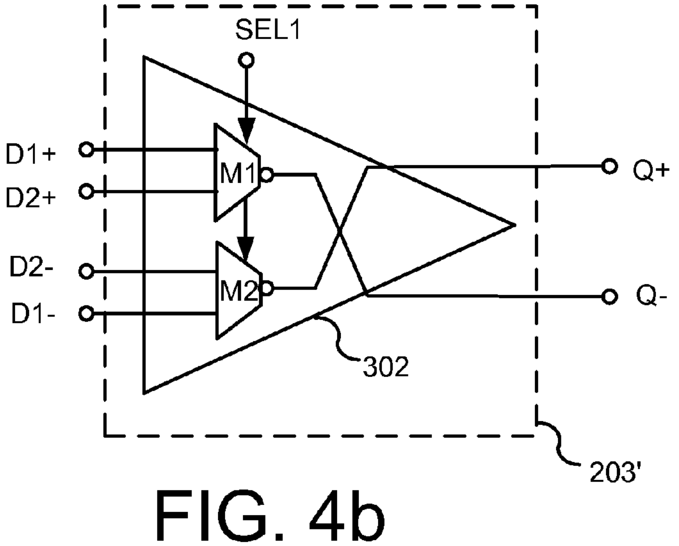

FIGS. 4*a*-*b* show exemplary implementations of delay path 110' and delay unit 203' respectively. These implementations are illustrative only, and other configurations are also useful. Referring to FIG. 4*a*, a differential implementation of a delay path is shown. It should be understood that a non-differential implementation may also be used. In one implementation, an optional injection device 302 is coupled to the input terminal 301 to receive an input timing event. The injection device 302 comprises, for example, a splitter (not shown) operable to split the input timing event into differential first signal portion 304*a* and second signal portion 304*b*, and to direct the first and second signal portions 304*a* and 304*b* to first and second input ports of a delay unit 203. In yet another implementation, the injection device comprises a pulse generator. The pulse generator generates a pulse (i.e., timing event) in response to a new timing signal, and delivers it to the delay path.

Delay units 203' may be coupled in series to form a ring. A non-ring configuration is also useful. Timing events propagate through delay units 203' to arrive at counter unit 204 at the output leads 306*a* and 306*b*. Although the output leads as shown are twisted, untwisted output leads are also useful. Untwisted output leads are useful, for example, if the timing event comprises a pulse. Twisted output leads are useful if the timing event comprises an active transition or edge. A timing event loops through delay path 110 for each increment of a counter in counter unit 204. Counter unit 204 provides the output count at output terminals 303*a*-*m*. The transit time of the timing event through delay path 110 is equal to one period $T_0$ of the TDC.

FIG. 4*b* illustrates one implementation of a delay unit 203', which comprises a differential delay element 302. Other types of delay elements, such as static delay elements, simple inverters, analog delay elements or logic gates, are also useful. For example, the delay element 203' may be an inverter device, such as a CMOS inverter, with high drive strength. In one implementation, the delay element provides multiplexing of input differential signals. This allows the delay element 110 to function as an injection point. For example, the delay element may comprise multiplexers M1 and M2, including first and second pairs of differential input terminals D1+/D1− and D2+/D2− respectively. In one implementation, a first pair of differential input terminals is coupled to a first portion of the delay line to receive previously injected timing events propagating within the delay path. Second pair of differential terminals is coupled to the selection unit 210 (not shown) to receive a new timing event that is to be injected into the delay path. A control signal SEL1 is used to select either first or second pairs of differential input terminals. The control signal SEL1 may be provided by the selection unit 201. The inverted output of the selected differential signal pair is produced as Q+ and Q−.

Figure 5A:
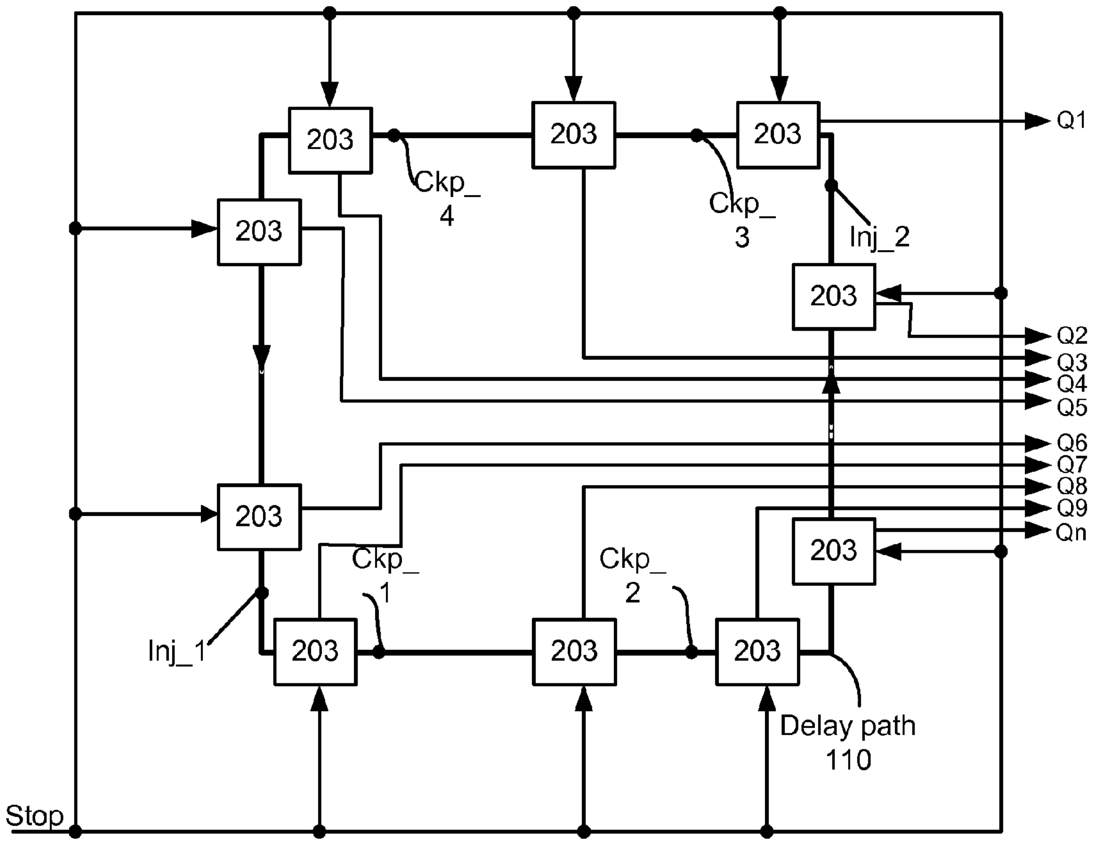
FIGS. 5*a-b* show exemplary implementations of a delay path and delay unit respectively.
Figure 5B:
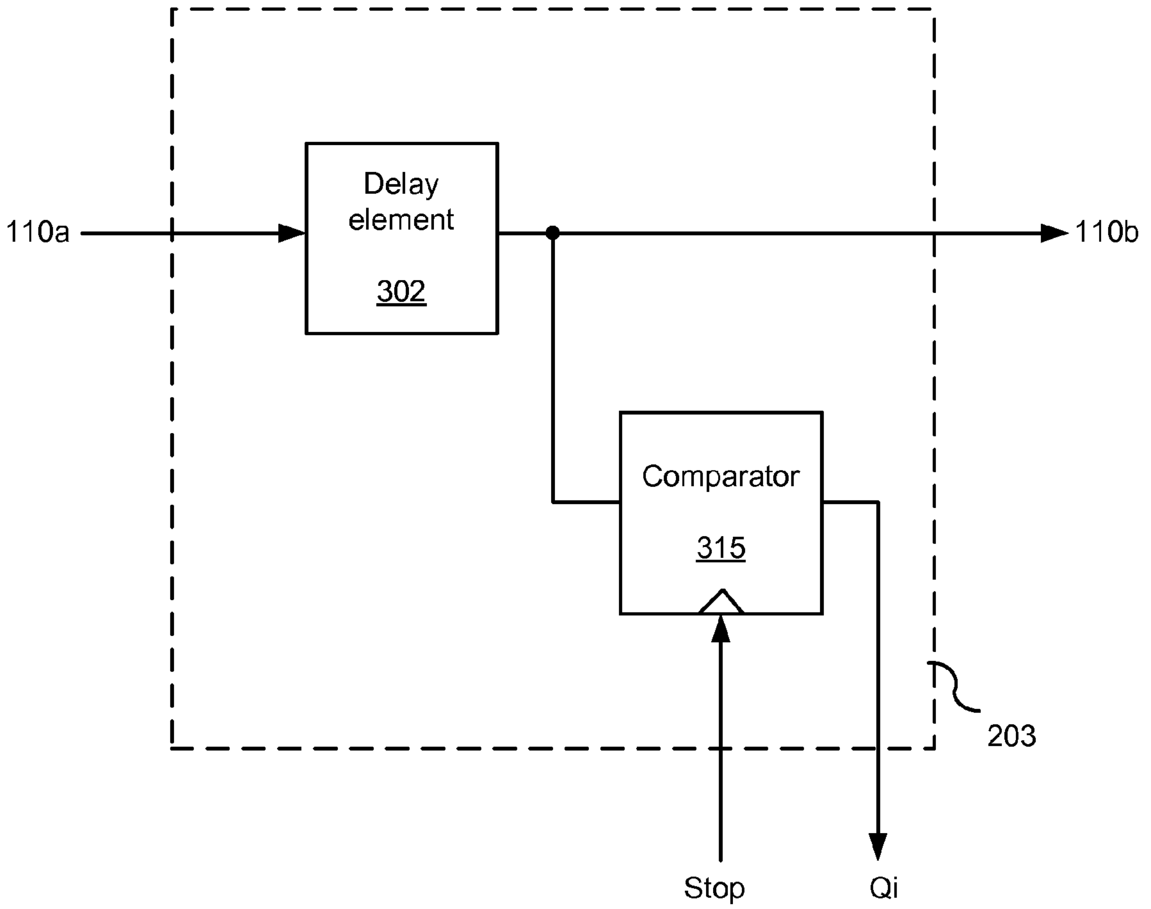
Figure 5C:
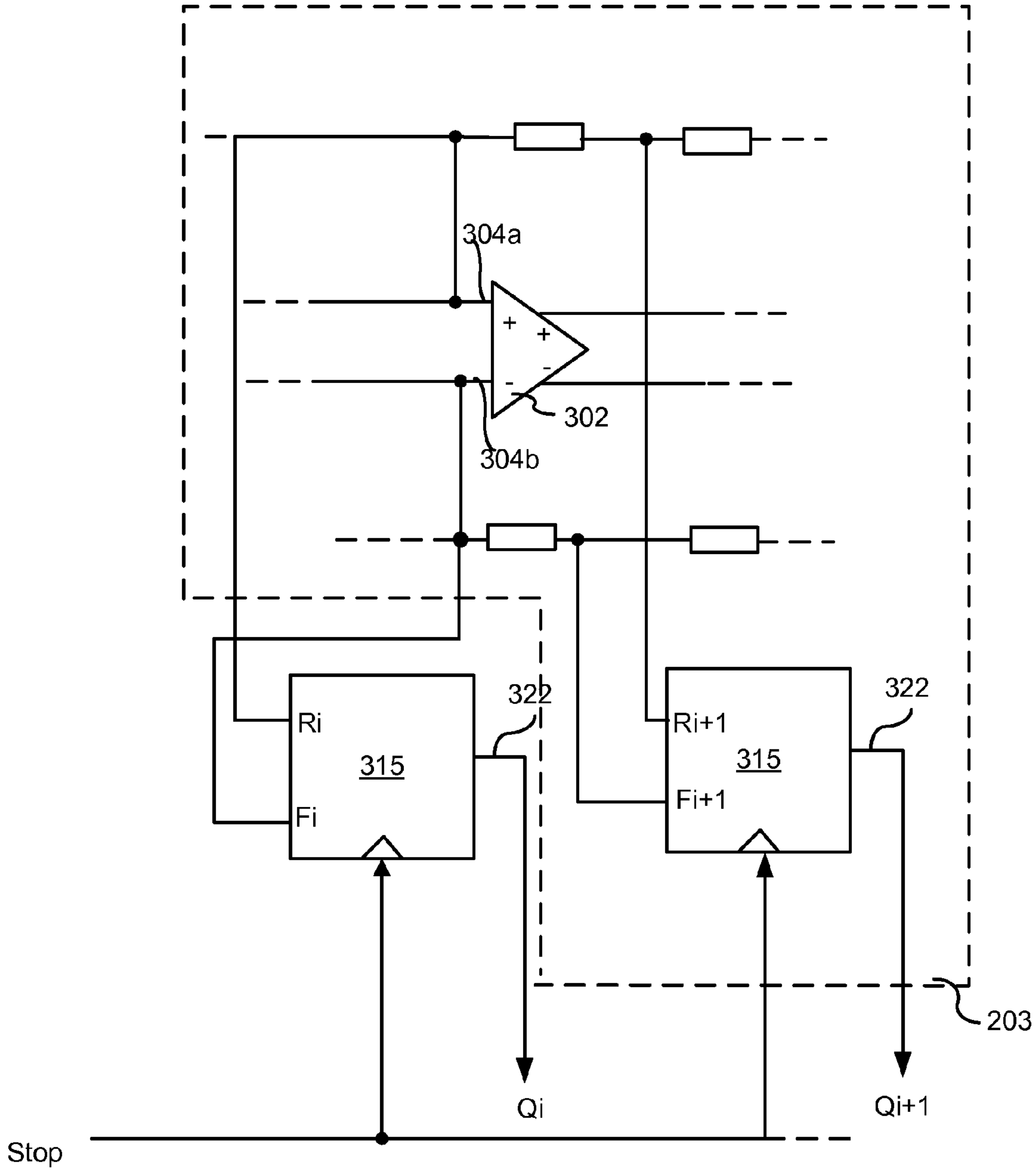
FIG. 5*c* shows an alternative implementation of a delay unit.

FIG. 5*a* shows another exemplary implementation of a delay path 110. A plurality of taps (Q1 to Qn) may be provided along the delay path 110. This allows the output at a delay unit 203 to be tapped in response to a "stop" signal. The resolution of the TDC may be increased through the use of the plurality of taps, providing a minimum resolvable time of $T_0/n$. FIGS. 5*b* and 5*c* show various exemplary implementations of delay unit 203, operable to provide at least one tap output (e.g., Qi).

Referring to FIG. 5*b*, delay unit 203 comprises a delay element 302 and a comparator (or flip-flop) 315. Delay element 302, as described above, comprises any type of delay device (e.g., inverter). Comparator 315 is clocked by a "stop" signal. It allows the input signal from the delay path 110*b* to be tapped as output signal Qi, in response to the "stop" signal. The comparator holds the output signal Qi constant after the triggering edge of the stop signal.

FIG. 5*c* shows a differential implementation of a delay unit 203 operable to provide tap outputs Qi and Qi+1. As described in reference to FIG. 4*a-b*, differential delay element 302 receives first and second signal portions (304*a-b*) from the differential delay path. Comparators 315 are coupled to the R and F output terminals of the differential delay path, and clocked by the "stop" signal.

Figure 5D:
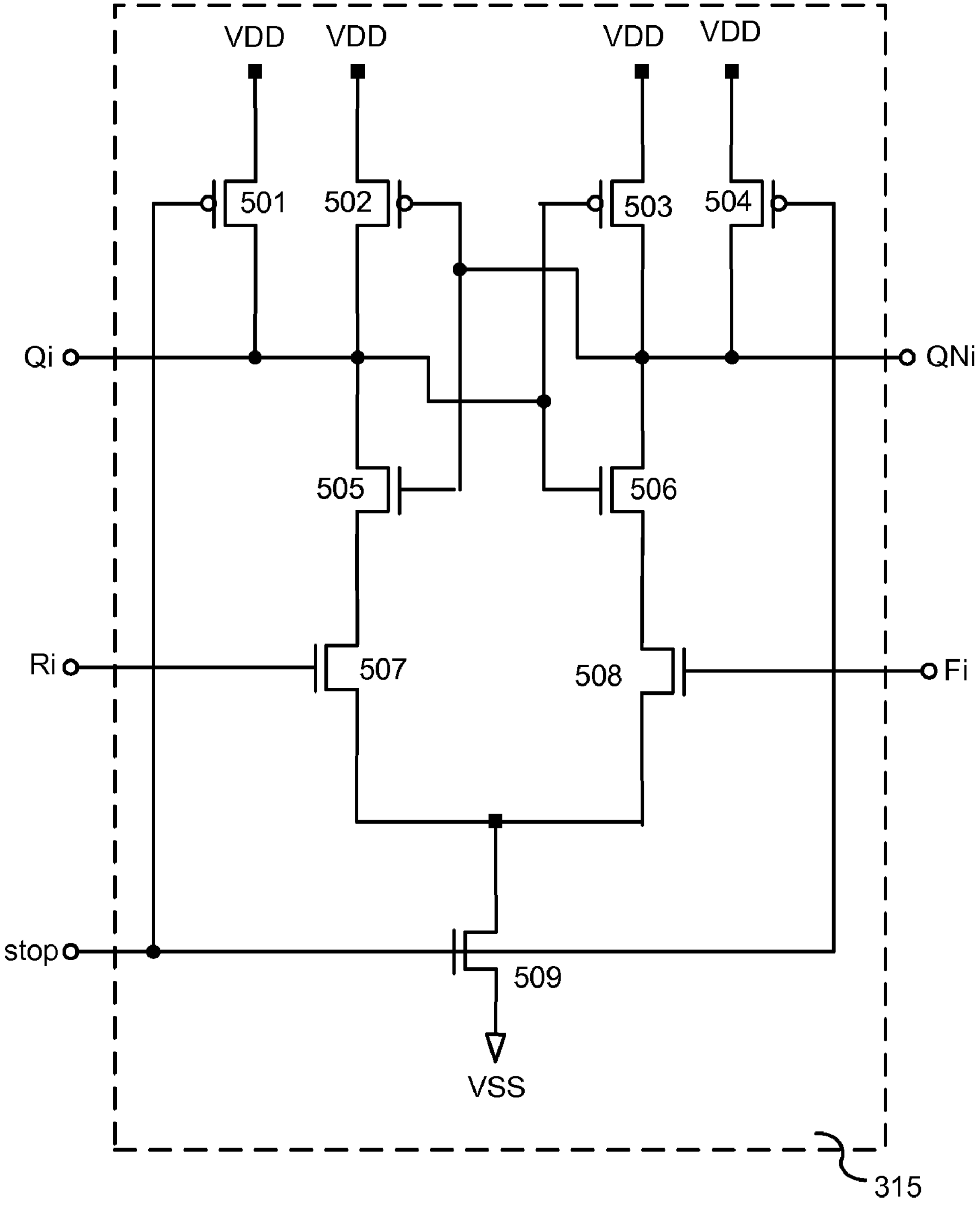
FIG. 5*d* shows a schematic diagram of an exemplary implementation of comparator.

FIG. 5*d* shows a schematic diagram of an exemplary implementation of comparator 315. In one implementation, comparator 315 comprises a sense amplifier circuit. The sense amplifier circuit may be hysteresis-free. It should be understood that other types of comparators are also useful. Sense amplifier circuit 315 shown in FIG. 5*d* converts the input signals Ri and Fi to complementary pair of first and second output signals Qi and QNi. Sense amplifier circuit 315 includes P-type transistors (502 and 503) and N-type transistors (505, 506, 507 and 508). A "stop" signal is applied to the gate of a sense enable transistor 509 to trigger or enable operation of the sense amplifier circuit.

In one implementation, first and second precharging devices (501 and 504) are provided to precharge the first and second output signals to a logic high when the "stop" signal is at a logic low. The precharging devices may be P-type transistors, gated with the "stop" signal. First precharging transistor 501 is connected between the power supply voltage VDD and the node of the first output signal Qi. Second precharging transistor 504 is connected between the power supply voltage VDD and the node of the second output signal QNi.

Figure 6:
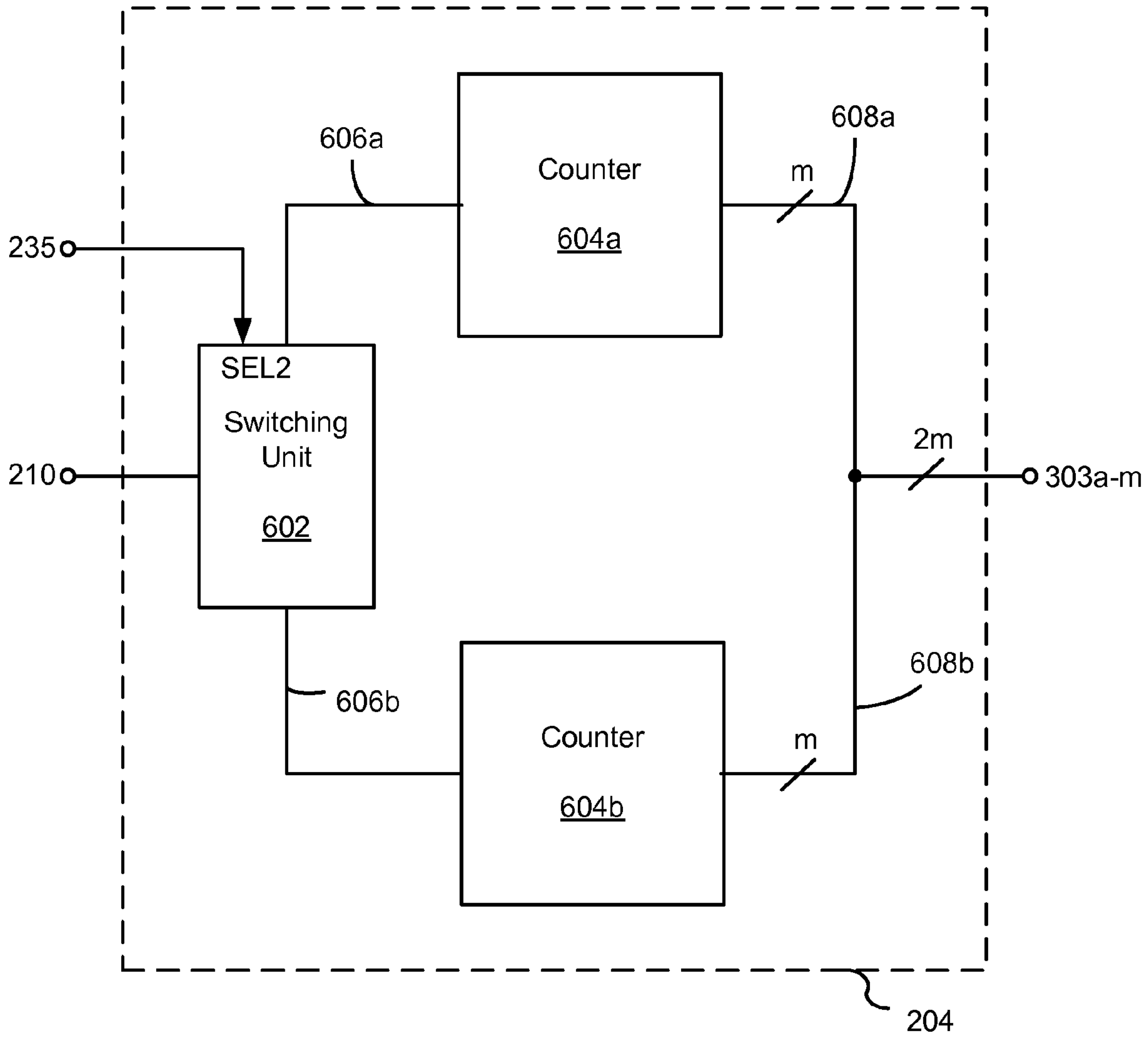
FIG. 6 shows an exemplary implementation of a counter unit.

FIG. 6 shows an exemplary implementation of counter unit 204. The counter is operable to measure multiple time intervals. Counter unit comprises switching unit 602, and first and second counters (604*a* and 604*b*). Switching unit 602 directs the input timing event received at input terminal 210 to the appropriate counter, depending on the state of a control signal SEL2.

The control signal SEL2 may be provided by sequencer 230, shown in FIG. 2, along path 235 to select the appropriate counter. With further reference to FIG. 2, sequencer 230 receives, from selection unit 201 via connector 220, the selection decision of which injection point is selected. The selection decision allows the sequencer 230 to determine the order at which the timing events will arrive at the input 210 of the counter unit 204, which in turn allows it to distinguish which timing event has arrived at the counter unit 204. The sequencer 230 then selects, in response to the occurrence of a timing event at input connector 210, the appropriate counter in counter unit 204. For example, referring back to FIG. 6, first counter 604*a* measures a first time interval and second counter 604*b* measures a second time interval. If a first timing event corresponding to the first time interval arrives at input connector 210, first counter 604*a* is selected. First counter 604*a* is then incremented in response to the occurrence of the first timing event at connector 606*a*. Similarly, if a second timing event corresponding to a second time interval arrives at input connector 210, second counter 604*b* is selected. The second counter 604*b* is then incremented in response to the occurrence of the second timing event at connector 606*b*.

The counter 604*a* (or 604*b*) measures the number of times a respective timing event loops around the delay path. For example, the counter 604*a* (or 604*b*) may measure the number of iterations for the respective pulse, thus performing a coarse time measurement. A finer time measurement may be derived from pseudo thermometer code generated by the tapped delay elements 203, such as those shown in FIG. 5*a*. A sequencing unit, such as sequencing unit 230, shown in FIG. 2, may be used to assign a 1→0 and 0→1 transition to the respective pulse.

In response to a stop timing signal, the respective counter (604*a* or 604*b*) forwards a composite binary word representing the respective count on the respective bus (408*a* or 408*b*), and subsequently to output terminals 303*a* to 303*m*. Although two counters are shown in FIG. 6, any other number of counters (e.g., 1, 3 and so forth) may also be used. The number of counters generally depends on the number of time intervals being measured simultaneously. Counters 604*a-b* may comprise any type of suitable counters, such as asynchronous counters, synchronous counters, Johnson counters, ring counters, decade counters or up-down counters.

Alternatively, the counter unit 204 may further comprise a plurality of memory units (e.g., registers) for storing multiple count values of a counter. For example, the counter unit may comprise first, second and third memory units for storing first, second and third count values of a single counter. In one implementation, the current counter value $C_i$ is stored in a memory unit i whenever a timing event is injected into the delay path. The number of times a respective timing event is propagated around the delay path may be determined by using the stored count values. For example, when 3 timing events have been injected into the delay path, the number of times ($X_1$, $X_2$ and $X_3$) the first, second and third timing events have propagated around the delay path can be computed by the following:

$$X_1=C_1+(C_2-C_1)/2+(C_3-C_2)/3$$

$$X_2=(C_2-C_1)/2+(C_3-C_2)/3$$

$$X_3=(C_3-C_2)/3$$

The sequencer may further add a correction term to each value ($X_1$, $X_2$ and $X_3$) depending on the status of the delay path on the arrival of the stop signal.

Figure 7:
FIG. 7 shows the timing diagram of a TDC when it is operated with first and second start signals.

FIG. 7 shows the timing diagram of TDC 100 when it is operated with first and second start signals (Start_1 and Start_2 respectively). Start_1 corresponds to the start of a first time interval to be measured, and Start_2 corresponds to the start of a second time interval to be measured. In one implementation, Blk_1 and Blk_2 control signals are used to block injection points Inj_1 and Inj_2 respectively, so as to prevent new input timing events from being directed to the respective injection points and interfering with preceding timing events propagating within the delay path. For example, a new pulse is prevented from being directed to injection point Inj_1 when Blk_1 is active (i.e. high). Similarly, a new pulse is prevented from being directed to injection point Inj_2 when Blk_2 is active (i.e. high). Thus, Blk_1 prevents a signal travelling from ckp_4 to ckp_1 from being interfered by a signal that would otherwise be injected at Inj_1.

As shown in FIG. 7, a first start signal Start_1 starts measurement of a first time interval. An active transition (i.e. low to high) in timing signal Start_1 triggers generation of first timing event 701. First timing event 701 then propagates around the delay path, arriving at Ckp_1 first, then Ckp_2, Ckp_3, Ckp_4, Ckp_1 and so forth. When first timing event arrives at Ckp_4, Blk_1 is activated to prevent selection of Inj_1. When it arrives at Ckp_1, Blk_1 is deactivated to allow Inj_1 to be selected. Similarly, when first timing event arrives at Ckp_2, Blk_2 is activated to prevent selection of Inj_2. When it arrives at Ckp_3, Blk_2 is deactivated to allow Inj_2 to be selected.

A second start signal Start_2 can be used to start measurement of a second time interval. An active transition (i.e. low to high) in timing signal Start_2 triggers generation of a second timing event 702 (shown in bold lines). Since Blk_1 is blocked and Blk_2 was inactive when Start_2 occurred, Inj_2 is selected to insert second timing event. Second timing event 702 arrives at Ckp_3 first, followed by Ckp_4, Ckp_1, Ckp_2 and so forth. The respective control signals Blk_1 and Blk_2 are updated accordingly, while the timing events propagate the delay path. Second timing event 702 arrives at counter unit 204 before first timing event 701. A Stop signal can be used to stop measurement of either first or second time intervals, or both.

Partial Resetability

After a measurement is completed, it may desirable to reset portions of the TDC to an inactive state so as to remove previously injected timing events of the completed measurement, while leaving timing events of non-completed measurements propagating within the delay path.

Figure 8A:
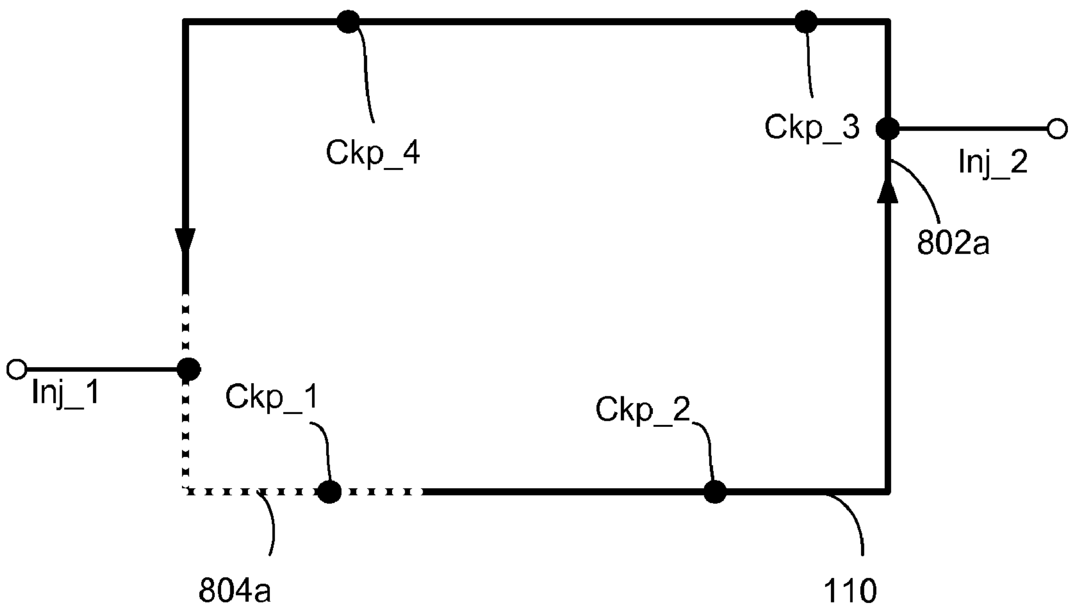
FIGS. 8*a-b* illustrate the partial reset of a delay path.
Figure 8B:
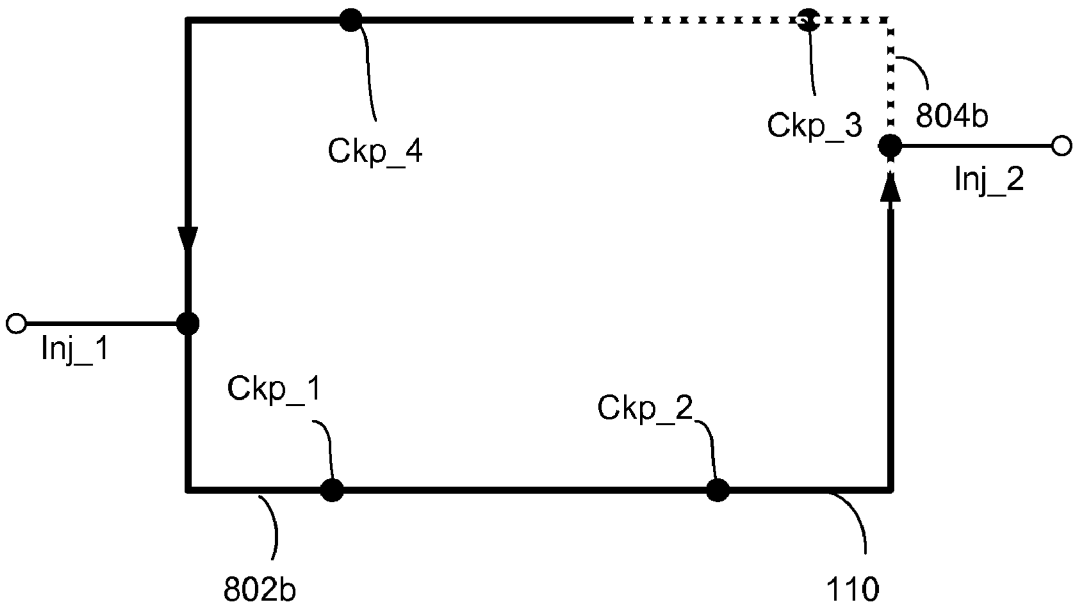

FIGS. 8*a*-*b* illustrate how a delay path can be partially reset. In one implementation, delay path 110 comprises first reset zone 802*a* (as shown in FIG. 8*a*) and second reset zone 802*b* (as shown in FIG. 8*b*). In one implementation, timing events within first reset zone 802*a* are removed in response to a first reset signal RZ_1. Timing events within second reset zone 802*b* are removed in response to a second reset signal RZ_2. Timing events propagating outside of the reset zones, such as within portions 804*a* (shown in broken lines in FIG. 8*a*) and 804*b* (shown in broken lines in FIG. 8*b*), are not removed.

Figure 9:
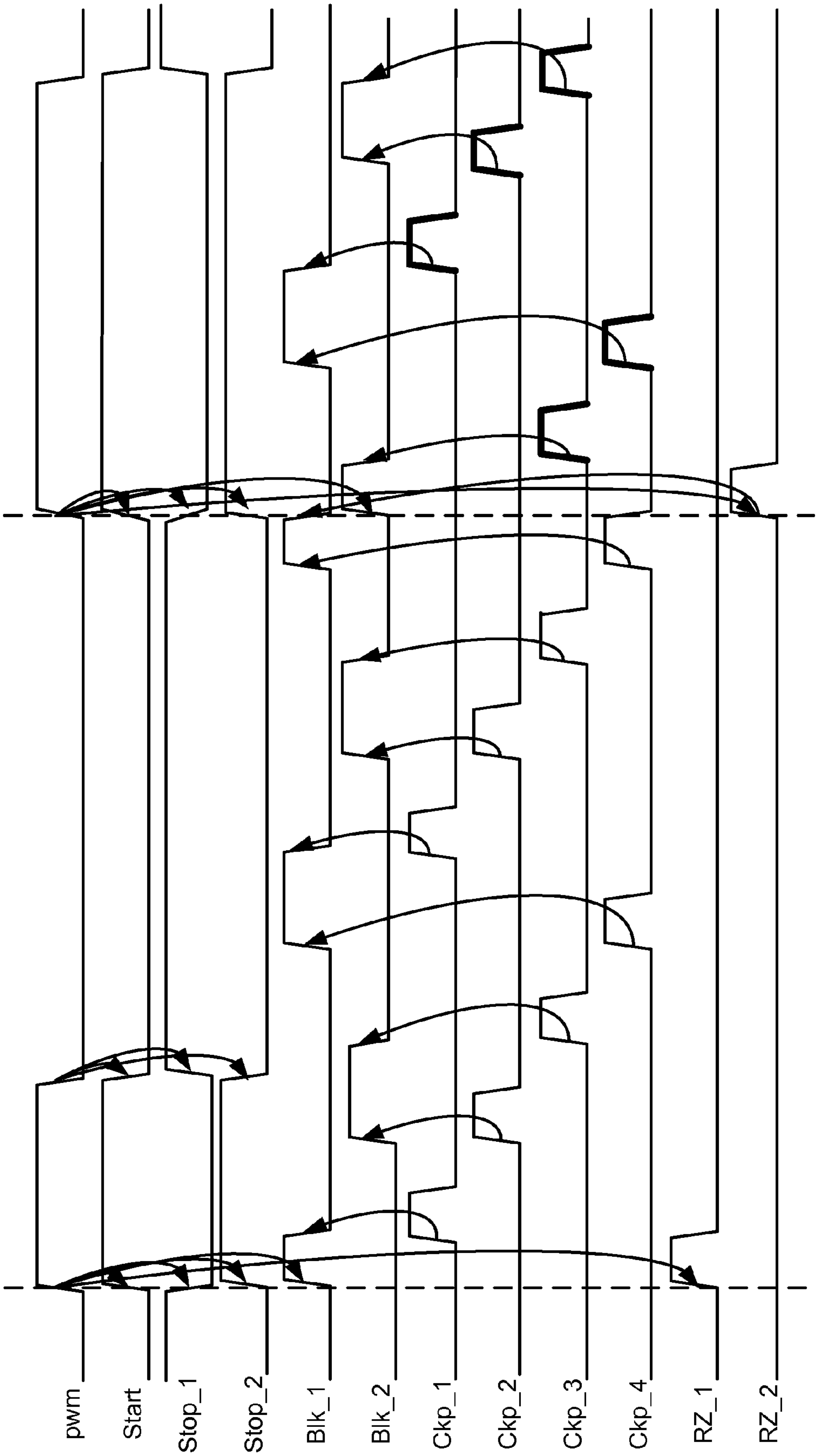
FIG. 9 shows a timing diagram of a partial reset operation.

FIG. 9 shows a timing diagram of a partial reset operation. When first reset signal RZ_1 is activated, first timing event 901 is propagating outside first reset zone (at Ckp_1) and is therefore not removed from the delay path. First pulse 901 continues to propagate around the delay path until second reset signal RZ_2 is activated. At the time RZ_2 is activated, first timing event 901 is propagating within second reset zone and is therefore removed from the delay path. Second timing event 902, on the other hand, is injected via injection point Inj_2 and is propagating outside second reset path (at Ckp_3). Therefore, second timing event 902 is not affected by the partial reset and remains in the delay path to propagate to Ckp_4, Ckp_1, Ckp_2 and so forth.

Other Exemplary Devices

Figure 10:
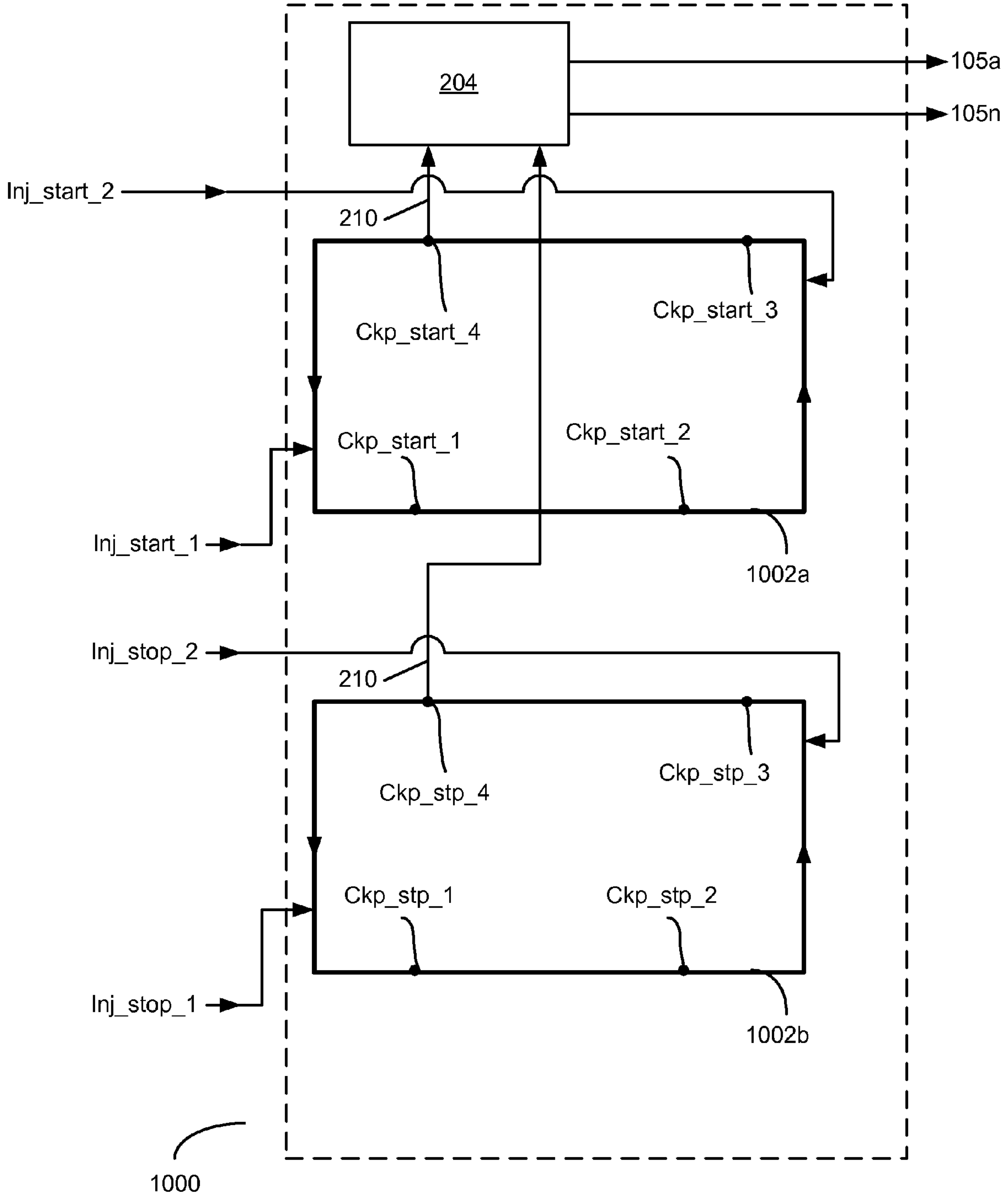
FIG. 10 shows an exemplary Vernier TDC.

The present techniques can also be implemented using other types of TDC circuit principles. For example, FIG. 10 shows an exemplary Vernier TDC 1000 with first and second delay paths (1002*a* and 1002*b*). Vernier TDC 1000 is operable to measure multiple time intervals simultaneously utilizing counter unit 204. First delay path 1002*a* receives a start pulse at one of the injection points Inj_start_1 or Inj_start_2. The injection point is selected so as not to interfere with the propagation of any preceding start pulses. In one implementation, the injection point is selected based on the current location of any preceding start pulses propagating within the first delay path. Similarly, second delay path 1002*b* receives a stop pulse from one of the injection points Inj_stop_1 or Inj_stop2. The stop pulse is directed to the appropriate injection point to avoid interfering with any preceding stop pulses.

Examples of other types of TDC principles that can be used in different implementations include pulse shrinking TDCs, TDCs employing parallel scaled delay lines, delay-locked loops or local passive time interpolation (LPI).

Exemplary Method

Figure 11:
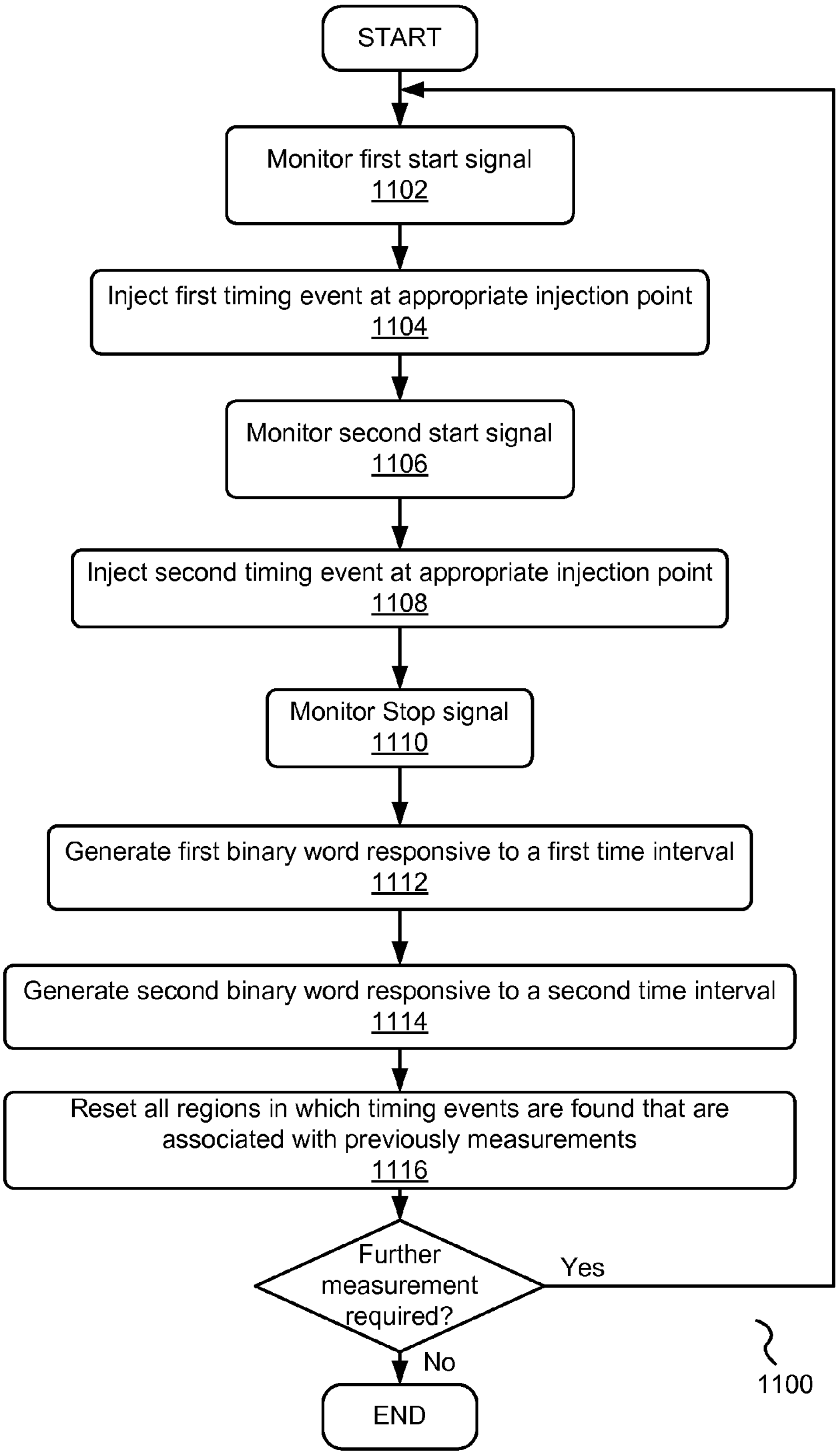
FIG. 11 shows a flow chart illustrating an exemplary method of measuring multiple time intervals.

FIG. 11 is a flow chart showing an exemplary method 1100 of measuring multiple time intervals.

At 1102, a first start signal (e.g., start_1 corresponding to the start of a first time interval) is monitored. When an active transition is detected in first start signal, method 1100 proceeds to step 1104.

At 1104, a first timing event is generated and injected into the delay path of the TDC at the appropriate injection point. The appropriate injection point may be selected based on the states of control signals Blk_1 and Blk_2.

At 1106, a second start signal (e.g., start_2 corresponding to the start of a second time interval) is monitored. When an active transition is detected in second start signal, a second timing event is generated and injected at step 1108.

At 1108, the second timing event is injected into the delay path of the TDC at the appropriate injection point, without interfering with any pulses already propagating within the delay path. The appropriate injection point may be selected based on the states of control signals Blk_1 and Blk_2.

At 1110, a stop signal (e.g., stop_1 corresponding to end of first time interval and the second time interval) is monitored until an active transition is detected.

At 1112, a first binary word is generated. The first binary word is responsive to the first time interval being measured.

At 1114, a second binary word, responsive to the second time interval being measured, is generated. Although only 2 time intervals are measured in this illustration, it is apparent to those of ordinary skill in the art that the number of time intervals that can be measured is not to be restricted. It is also understood that the method can be modified for measuring other types of time intervals, such as illustrated by the examples shown in FIG. 1*c*.

At 1116 certain regions are reset in order to eliminate all timing events just propagating in these regions. All regions are reset in which the timing events/pulses are located which are associated with the measurements which have been already finished. If additional measurements are required or desired, the process returns to 1102.

Although specific details of exemplary methods have been described above, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

CONCLUSION

For the purposes of this disclosure and the claims that follow, the terms “coupled” and “connected” may have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A device comprising:

at least one delay path for propagating at least one timing event, the delay path including a plurality of delay elements; and a plurality of injection points provided along the delay path, each of the injection points being provided at a respective portion of the delay path located between two of the delay elements and not co-located with a delay element, and the injection points being configurable to receive the at least one timing event and to deliver the at least one timing event to the delay path.

2. The device of claim 1 further comprising a counter unit coupled to the delay path, the counter unit configurable to measure, in response to multiple timing events, multiple time intervals.

3. The device of claim 1 further comprising a selection unit coupled to the plurality of injection points, the selection unit being configurable to select one of the injection points for receiving a new timing event.

4. The device of claim 3 wherein the selection unit selects an injection point based on a current position of a timing event propagating in the delay path.

5. The device of claim 4 further comprising a plurality of checkpoints provided along the delay path and coupled to the selection unit to monitor the current position of any propagating timing events.

6. The device of claim 1 wherein the delay path includes a portion comprising at least one partial reset zone, and wherein the at least one partial reset zone is reset in response to a reset signal.

7. The device of claim 1 wherein the plurality of delay units are coupled in a ring configuration.

8. The device of claim 2 wherein the counter unit comprises a switching unit coupled to a plurality of counters, and wherein the switching unit directs the at least one timing event to its respective counter.

9. The device of claim 1 further including a plurality of taps provided along the delay path.

10. The device of claim 1 wherein at least one of the plurality of injection points comprises a pulse generator.

11. The device of claim 1 wherein at least one of the plurality of injection points comprises a pulse generator with at least two inputs, each input operable to create a pulse at the output of the pulse generator.

12. The device of claim 11 wherein the pulse generator is directly embedded in the delay path.

13. The device of claim 11 wherein the pulse generator receives one trigger signal from the delay path.

14. The device of claim 11 wherein the pulse generator receives a trigger signal from a delay element of the plurality of delay elements.

15. A time-to-digital converter comprising:

at least one delay path for propagating at least one timing event;

a plurality of injection points provided along the delay path, the injection points being configurable to receive the at least one timing event and to deliver the at least one timing event to the delay path;

a counter unit coupled to the delay path, the counter unit configured to measure, in response to the at least one timing event, at least one time interval, the counter unit comprising a switching unit coupled to a plurality of counters, wherein the switching unit directs the at least one timing event to a respective counter associated with the at least one timing event; and a selection unit coupled to the plurality of injection points, the selection unit being configurable to select one of the injection points for receiving a new timing event based at least in part on a current position of a timing event propagating in the delay path.

16. The time-to-digital converter of claim 15 wherein the delay path comprises first and second partial reset zones, wherein the first partial reset zone is reset in response to a first reset signal and the second partial reset zone is reset in response to a second reset signal.

17. The time-to-digital converter of claim 15 wherein the delay path comprises a plurality of delay units coupled in a ring configuration.

18. A method of measuring at least one time interval, comprising:

propagating at least one first timing event in a delay path;

monitoring a position of the first timing event;

selecting at least one injection point provided along the delay path based on the position of the first timing event;

applying a second timing event to the selected injection point without interfering with the first timing event;

propagating the second timing event in the delay path; and generating at least one binary word in response to a stop signal, wherein the binary word is representative of a particular time interval being measured.

19. The method of claim 18 wherein monitoring the position of the first timing event comprises monitoring a plurality of checkpoints provided along the delay path.

20. The method of claim 18 further comprising resetting a portion of the delay path after a new timing event is injected.

21. The method of claim 20 wherein resetting the portion of the delay path comprises removing at least one timing event from the delay path.

22. The method of claim 20 wherein resetting the portion of the delay path does not affect at least one timing event in the delay path.

23. The method of claim 18 wherein generating the at least one binary word in response to the stop signal comprises generating first and second binary words in response to the stop signal, and wherein the first binary word is responsive to a first time interval and the second binary word is responsive to a second time interval.

* * * * *